US009391599B2

(12) United States Patent
Snook et al.

(10) Patent No.: US 9,391,599 B2

(45) Date of Patent: Jul. 12, 2016

(54) SWITCHING CONTROL SYSTEM SIGNALING TECHNIQUES

(71) Applicant: Amantys Ltd, Cambridge, Cambridgeshire (GB)

(72) Inventors: Mark Snook, Cambridge (GB); Edward Shelton, Cambridge (GB); Stephen Parker, Cambridge (GB); Matteo Vit, Cambridge (GB)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 42 days.

(21) Appl. No.: 14/367,580

(22) PCT Filed: Nov. 28, 2012

(86) PCT No.: PCT/GB2012/052926

§ 371 (c)(1), (2) Date: Jun. 20, 2014

(87) PCT Pub. No.: WO2013/093412

PCT Pub. Date: Jun. 27, 2013

(65) Prior Publication Data

US 2015/0326215 A1 Nov. 12, 2015

(30) Foreign Application Priority Data

Dec. 23, 2011 (GB) .................................. 1122286.6

(51) Int. Cl.

*H03K 17/082* (2006.01)
*H02J 13/00* (2006.01)
*H03K 17/18* (2006.01)

(52) U.S. Cl.

CPC ........ *H03K 17/0822* (2013.01); *H02J 13/0062* (2013.01); *H03K 17/18* (2013.01); *Y02E 60/7838* (2013.01); *Y04S 40/124* (2013.01)

(58) Field of Classification Search

CPC .................................................. H03K 17/063

See application file for complete search history.

(56) References Cited

U.S. PATENT DOCUMENTS 5,900,683 A 5/1999 Rinehart et al.
8,525,371 B2 * 9/2013 Shindo .................. B60L 3/0007 307/109
2011/0278918 A1 11/2011 Shindo et al.

FOREIGN PATENT DOCUMENTS

DE 3826509 A1 6/1989
DE 102005045957 A1 11/2006

(Continued)

OTHER PUBLICATIONS

International Search Report and Written Opinion from corresponding International Application No. PCT/GB2012/052926, Mailed Apr. 4 2013.

(Continued)

*Primary Examiner* — Hai L Nguyen

(74) *Attorney, Agent, or Firm* — Andrew Wilford

(57) ABSTRACT

Switching data is communicated in a power semiconductor switching device control system having a coordinating control system and a switching device controllers each coupled to the coordinating control system and each configured to control a respective power semiconductor switching device. Switching control data is formatted as one or more switching control data packets whose switching control data comprises data for controlling switching of the power semiconductor switching devices. The switching control data packets are sent from the coordinating control system to the switching device controllers. State data is detected, provided, and then formatted to represent states of the power semiconductor switching devices controlled in combination by the switching control data packets into acknowledgment data packets from the power semiconductor switching devices. The acknowledgment data packets are sent from the switching device controllers to the coordinating control system.

12 Claims, 11 Drawing Sheets

(56) References Cited

FOREIGN PATENT DOCUMENTS

| | | | |
|---|---|---|---|
| EP | 1439635 | A2 | 7/2004 |
| GB | 2215147 | A | 9/1989 |
| WO | 2007/006705 | A1 | 1/2007 |
| WO | 2011/147055 | A1 | 12/2011 |

OTHER PUBLICATIONS

Search Report from corresponding UK Application No. GB1122286.6, mailed Mar. 18, 2013.

* cited by examiner

400
CC
402
CC (1A)
406
CC (1B)
406
CC (2A)
406
CC (2B)
406
SD (1.1)
SD (1.2)
SD (1.x)
SD (1.23)
SD (1.24)
SD (2.1)
SD (2.2)
SD (2.x)
SD (2.23)
SD (2.24)
408
404
404b
410a
410b
412
Ethernet
UP
UPA
UPB

SWITCHING CONTROL SYSTEM SIGNALING TECHNIQUES

CROSS REFERENCE TO RELATED APPLICATIONS

This application is the US-national stage of PCT application PCT/GB2012/052926 filed 28 Nov. 2012 and claiming the priority of British patent application 112286.6 itself filed 23 Dec. 2011.

FIELD OF THE INVENTION

This invention relates to a process for acquiring real/current characteristic data of a mobile radio system, for example according to GSM, UMTS, E-UTRAN/LTE or WiMAX standards, by a mobile radio terminal device of a real user of this mobile radio system.

BACKGROUND OF THE INVENTION

The prior art is the examination of corresponding parameters of a mobile radio network by dedicated test runs that require a cost-intensive use of personnel and material. In addition, these processes have the drawback that only discrete partial areas of a mobile radio system can be acquired with such methods, e.g., measurements of the supply quality of a mobile radio system along streets and highways. Another drawback consists in that these test runs cannot be performed continuously and over large areas, and therefore measurement results cannot always be available for the current status or for large areas.

An optimized variant of the process of the dedicated test runs for acquiring network parameters is described in DE 199 00 543: in the process described therein, special users of a mobile radio system are recruited to acquire relevant parameters of a mobile radio network, and these acquired measured values are transmitted upon the occurrence of a previously determined event to an analysis device of the mobile radio network by means of signaling channels (SMS). To acquire the position, an external device ("storage and processing module") is required to determine the current position of the mobile radio device within the network topology (in addition, optional external GPS receiver and optional personal computer). The use of one or more external accessory devices ("storage and processing module" & GPS receivers) represents an unreasonable expense for a normal mobile radio user, whereby the applicability of this process remains limited to specifically equipped operators (for example, buses, taxis, trucks, etc., but not "normal" mobile phone users).

The prior art is thus systems for the acquisition of the characteristic data of a mobile radio system that acquire the data to be determined on the user side by a subscriber terminal device (MS: mobile station, UE: user equipment), forward said data to an external storage and processing unit and provide them with location information (position) by means of accessory hardware (e.g., external GPS receiver), and forward them via user data channels (GPRS) or signaling channels by means of SMS (e.g., via the SDCCH channel with GSM) to the mobile radio network for further processing/analysis, cf. DE 199 00 543.

As an alternative, processes are also known that buffer the recorded data in a data storage unit that has to be specially read out for the purpose of processing these data; this approach is common in dedicated test runs in mobile radio networks.

OBJECT OF THE INVENTION

The object of the invention is to indicate a process for acquiring real/current characteristic data of a mobile radio system that overcomes the above-mentioned drawbacks and allows it in a reliable and reasonably-priced way to acquire characteristic data of a mobile radio system over large areas, whereby the hardware expense as well as necessary labor input are to be considerably reduced.

SUMMARY OF THE INVENTION

This object is achieved according to the invention in that the acquisition of parameters of a mobile radio system, in particular a cellular mobile radio network, is carried out in particular according to GSM, UMTS, E-UTRAN/LTE or WiMAX standards in that parameters of the mobile radio system, in particular the cellular mobile radio network, are acquired by means of mobile radio terminal devices, in particular by serial subscriber terminal devices of users of this network, without additional external devices for determination of position, Such as in particular external GPS receivers or a storage and processing module, and are forwarded to a centralized or decentralized/distributed acquisition, analysis and processing unit in the network.

According to the invention, it is provided that relevant characteristic data of the mobile radio network at the current position of the mobile radio subscriber of this mobile radio network are acquired directly by the mobile radio terminal device of the user under normal conditions of use, and optionally can be provided with position indication, and that these measured data are forwarded from a mobile radio terminal device via standardized signaling channels of a mobile radio system, preferably according to GSM, UMTS, E-UTRAN/LTE or WiMAX standards, to an analysis unit of the mobile radio operator.

The subsequent further processing of the thus forwarded data can advantageously be used for planning and optimization of the radio network infrastructure (neighborhood planning, setting of other operating parameters, etc.) as well as also for the demand-oriented provision of specific data contents for the mobile radio user (customers), however. Motivation in this respect also produces the support of the procedures, with respect to the reduction of operational expenses that support certain processes in the mobile radio network and parameters thereof in a self-optimizing manner (goal: self-optimizing network, SON).

The measured values and processes that are shown in this step form the basis for the sell-optimizing procedures but are not limited to the measured values, procedures and scenarios that are shown. One embodiment of the process according to the invention also calls for an automatic acquisition and provision of the recorded measured data without the user of a mobile radio terminal device having to take part actively himself.

The advantage of this invention compared to the prior art is the elimination of additional external devices in the form of measuring or position acquisition hardware or software and the optional use without additional expense on the part of the user, as well as without his support.

For the application of the process that is described here, commercially available mobile radio terminal devices, preferably GSM, UMTS, E-UTRAN/LTE or WiMAX terminal devices, are used. Additional advantages of the process according to the invention are the ability to have the measuring fields predefined and to have a specific field analyzed by measurement technology carried by the normal mobile radio subscribers without manual intervention or use of accessory devices. A significant advantage of an embodiment of the process according to the invention is the option of performing the measurement when entering a predefined acquisition field.

In the process according to the invention for acquisition of parameters of a mobile radio system, in particular a cellular mobile radio network, it is especially advantageous that parameters of the mobile radio system, in particular of the cellular mobile radio network, are acquired by means of mobile radio terminal devices and are forwarded to a centralized or decentralized/distributed acquisition, analysis and processing unit in the network.

In the mobile radio system or mobile radio network, this can be in particular a network according to GSM, UMTS, E-UTRAN/LTE or WiMAX standards, but the application of the process is not limited to the above-mentioned network standards. In particular, quality data, range, signal strength, network load, availability at the current position, supply quality, etc., can fall under parameters. The acquisition and relaying of the parameters or characteristic data of the mobile radio system or mobile radio network is thus carried out by using serial subscriber terminal devices of the users of this network, without additional external devices for determining position, such as in particular external GPS receivers or a storage and processing module.

In this case and below, the term GPS receiver is understood to be a synonym for any type of device for determining position by means of satellites or satellite navigation systems, without this producing a limitation to the global positioning system GPS. This can be any satellite-supported positioning process.

Preferably, the forwarding of the characteristic data to the acquisition, analysis and processing unit is carried out via signaling channels of the respective system.

In a preferred embodiment, the process as well as the necessary procedures to this end can be an integral component of the GSM, UMTS, E-UTRAN/LTE or WiMAX system and neither the acquisition of characteristic data, nor the linking of measurements to the current position, nor the forwarding to the acquisition, analysis and processing unit are carried out on the application plane, but rather signaling channels of the respective system can be used.

Preferably, standardized parameters of the mobile radio system are linked to position indication of the current acquisition site, and the latter is forwarded to the acquisition, analysis and processing unit of the mobile radio system.

In mobile radio systems according to the UMTS or E-UTRAN/LTE standard, the parameters can be in particular CPICH Ec/No, CPICH RSCP, CPICH RSRP, path loss, SIR, BLER, data throughput, data on the "active set," transmission power, etc. In mobile radio systems according to GSM/GERAN standards, the parameters can be in particular RxLEV, RxQual, transmission power, and path loss.

The above-mentioned parameters can be linked to position indication of the current acquisition site and to which the acquisition, analysis and processing unit of the mobile radio system can be forwarded.

In a preferred embodiment of the process according to the invention, a time stamp is appended to the acquired parameters; in particular, a time stamp can be appended by the mobile radio terminal device before the forwarding to the acquisition, analysis and processing unit or it can be appended by the acquisition, analysis and processing unit to the parameters that are obtained at the time of reception.

By appending a time stamp, additional analyses are possible while taking into consideration the time, such as, for example, times of maximum network load in the daytime in comparison to times of minimum network load in the nighttime.

In an especially preferred embodiment, the measured data that are obtained are used not only for maintaining the optionally present connection, but rather these data, provided with position indication and optionally a time stamp, are directed for analysis or further processing to an acquisition, analysis and processing unit of the mobile radio network.

The forwarding of currently acquired parameters of the mobile radio system is preferably carried out in the mobile radio system every time that the current halting position of the mobile terminal device was determined, in particular when using location based services, i.e., those services that are available in a position-dependent manner. The determination of the position of a mobile radio terminal device within a mobile radio network is carried out more or less routinely, such that the triggering of the acquisition and forwarding of current parameters of the mobile radio network based on the determination of the position of the mobile radio terminal device allows optimum data acquisition of data over as large an area as possible. For example, the acquisition and forwarding then are carried out when the subscriber of the mobile radio system queries certain position-dependent services, such as, e.g., when using location based services, since when using such services, the position of the mobile radio terminal device is known and thus an assignment of the acquired characteristic data to one position is easily possible.

Preferably, the measurements of current parameters of a mobile radio system are analyzed and worked up for determination and optimization of the supply quality of a mobile radio network that were determined from mobile radio terminal devices, in particular from real mobile radio subscribers, and were transferred to the system.

In this way, a network optimization is possible at considerably reduced expense relative to the process according to the prior art; in particular, data from larger areas are available for analysis.

Preferably, the position determination interrogation of a mobile terminal device in a mobile radio system is provided with a time stamp, and this position is stored and/or analyzed with the related request time or based on an interrogation of the position in an analysis unit initiated by the user.

Preferably, the acquisition and provision or linkage of the current position to a measured data of the parameters acquired at this site is performed by means of a GPS receiver that is integrated in the mobile radio terminal device.

The acquisition and provision or linkage of the current position to measured data acquired at this site can preferably then be performed every time that the terminal device is moved in a predetermined field by the operator of the network.

By triggering the acquisition and forwarding of the characteristic data of the mobile radio network in connection with a specific, i.e., a determinable, spatially limited field of the mobile radio network, comprising one or more cells of a cellular mobile radio network, a targeted data acquisition and spatial identification is possible; in particular, the availability and network quality in certain fields can be examined and analyzed specifically in this way.

In an especially preferred embodiment, the acquisition and provision or linkage of the current position to the measured data acquired at this site are performed every time that the positional measurement has taken place at a predefined time or within a predefined time interval.

For this purpose, certain time intervals, for example times of maximum network load in the daytime, can be subjected to an analysis.

Preferably, the acquisition of network quality data by a regular mobile radio subscriber is performed and forwarded to an acquisition, analysis and processing unit in the network every time that the subscriber terminal device has reached a predefined range of the mobile radio network.

As a result, it is possible to determine and to analyze characteristic data of the mobile radio network in connection in a specific, i.e., a determinable, spatially limited field of the mobile radio network, comprising one or more cells of a cellular mobile radio network. Thus, a targeted data acquisition and spatial identification is possible; in particular, the availability and network quality in certain fields can be examined and analyzed specifically in this way.

The predefinition of the acquisition area can be carried out by a field identifier used in mobile radio networks, in particular Location Area (LA), i.e., the halting area of the mobile radio terminal device, or Routing Area (RA) or UTRAN Registration Area (URA) or Tracking Area (TA) or cells or several of the above-mentioned field identifiers in combination.

Preferably, a predefinition of the acquisition area can be carried out by a description of a field-polygon, whereby a subscriber terminal device determines the current position by means of an integrated GPS receiver and, upon entry into the predefined field polygon, automatically begins in the mobile radio network with the acquisition of parameters and forwarding to the acquisition, analysis and processing unit.

The acquisition as well as the forwarding of the acquired data is preferably independent of the operating state (active/idle) of the subscriber terminal device. The reliability of the application of the process according to the invention can thus be carried out independently of the switching status of various mobile radio terminal devices.

Preferably, the forwarding of the acquired data is carried out in a signaling channel of the respective mobile radio system and not via channels that are usually subject to user data (SMS, Traffic Channel). In contrast to known processes according to the prior art, no traffic channel is thus taken up, or no channel resources are required by the transmission of SMS.

The acquisition of characteristic data or parameters of the mobile radio network is preferably based on standardized events, in particular the UMTS or E-UTRAN measurement reporting events; in particular, a measuring process can be activated when going below or above threshold values of parameters, whereby the threshold values were previously defined by the network relative to the subscriber terminal device.

As an alternative or cumulatively thereto, the acquisition of the characteristic data can be based on standardized events, in particular the UMTS or E-UTRAN measurement reporting events, and after a defined event occurs, the measurements as well as the forwarding of the characteristic values are carried out at periodic intervals for a specific time. As a result, it is possible to achieve a periodic data acquisition (periodic reporting).

As triggers for implementing acquisition and forwarding of network characteristic data, the events that are defined in 3GPP TS, 25.331, chapter 14, can thus be used in particular for UMTS.

In a preferred embodiment, the acquisition of characteristic data is based on defined situations of exception, in particular a break in a communication connection; in particular, after a situation of exception occurs, the measurements as well as the forwarding of characteristic values can be carried out for a certain time at periodic intervals. For this purpose, it is possible to achieve a periodic data acquisition (periodic reporting). At the same time, possible supply gaps in the mobile radio network are identified, if, for example, a cut-off of a discussion is used as a trigger for determining a characteristic value. In this connection, preferably also additional information on the location, the time, as well as the original cell (cell identity) and optionally the target cell (cell identity) can be forwarded in an abortive handover to the acquisition, analysis and processing unit of the mobile radio network.

Preferably, an anonymized storage of the forwarded parameters or characteristic data of the mobile radio network is carried out. In particular, the necessary data protection is adequately ensured by anonymized data storage.

A statistical analysis of the forwarded parameters or characteristic data of the mobile radio network is preferably carried out. Thus, the acquired network characteristic data can be used in particular for optimizing the network.

The parameters or characteristic data of the mobile radio network preferably reflect the supply quality and/or network parameters, as well as optionally the location and time of a connection break with additional parameters of the mobile radio network.

In a preferred embodiment, the parameters or characteristic data are filed and forwarded during a configurable time window.

Preferably, the positions of supply gaps in the mobile radio network are at least temporarily stored in the mobile radio terminal device and forwarded to the acquisition, analysis and processing unit of the mobile radio network, as soon as a connection to the mobile radio network exists again. In this way, supply gaps in the mobile radio network can be identified and documented in a simple and advantageous way.

Also, a computer program is claimed with a program code that, executed on a mobile radio terminal device, carries out a process according to the invention, as well as a computer program with a program code that is executed in a data-processing unit, and carries out a process according to the invention.

In addition, an arrangement of mobile terminal devices is claimed for acquiring parameters of a mobile radio system in a mobile communication network with adjacent radio cells, whereby in the mobile terminal device, at least one storage device and/or a data-processing unit are present that, during operation in the mobile communication network, acquires, processes and transfers the data, according to the process of the invention, to the mobile radio system.

BRIEF DESCRIPTION OF THE DRAWING

In the figures, various embodiments of the process according to the invention are shown and explained in more detail below. Here.

By way of example.

SPECIFIC DESCRIPTION OF THE INVENTION

Figure 1:
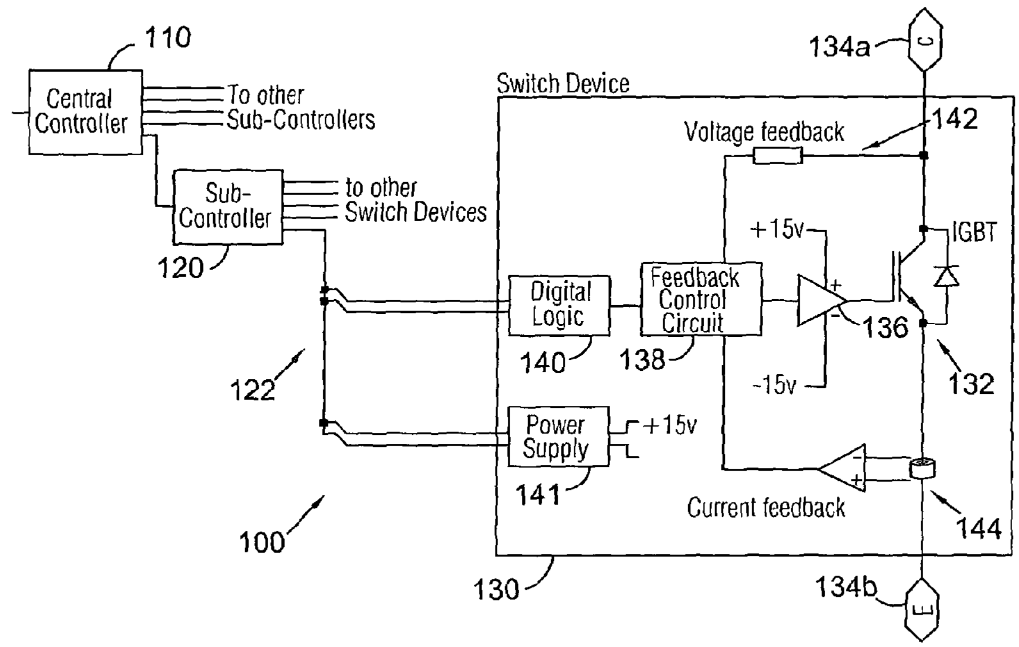
FIG. 1 diagrammatically shows cells of a mobile radio network and a definition of a measuring field based on CI, LA, RA, TA, etc.
Figure 6A:
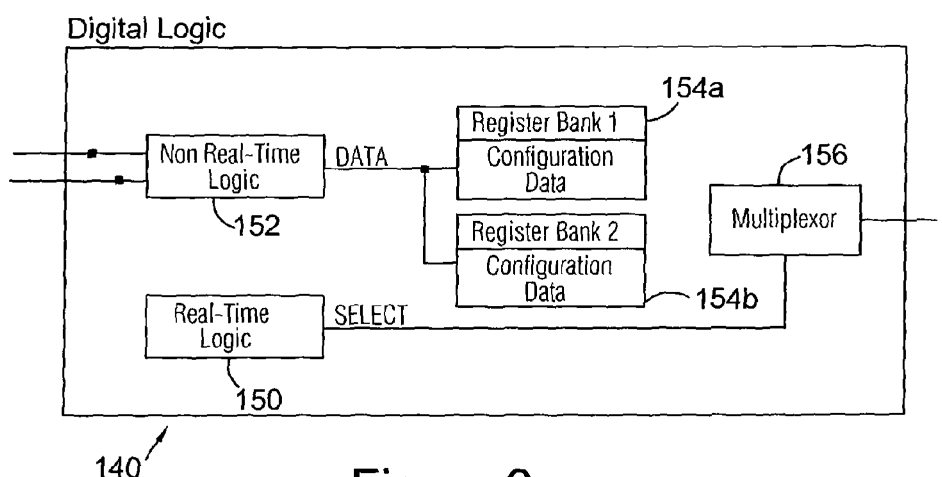

In FIG. 1, cells of a mobile radio network and a definition of a measuring field based on radio cell identity CI, Location Area LA, i.e., halting area of a mobile radio terminal device 1, Routing Area RA, Tracking Area TA, etc., are depicted diagrammatically.

Based on the special properties of a mobile radio channel, special procedures are necessary to use this channel for data transfer. These procedures are described and set by specific characteristic values. For the planning and operation of mobile radio systems, for example according to the GSM, UMTS, E-UTRAN/LTE or WiMAX standards, findings on the current parameters (RxLEV, RxQual with GSM, or CPICH RSCP, CPICH Ec/No, path loss, SIR, the "active set" with UMTS or the subfrequencies that are used in OFDM systems such as E-UTRAN/LTE or WiMAX) are essential in the entire field of a mobile radio network 3.

Relative to FIG. 1, the decisive advantage of the process that is described here relative to the prior art consists in that to determine the measured data and the linkage of the current acquisition site, no external or additional device whatsoever except for a serial, standardized mobile radio terminal device 1 with integrated positioning acquisition, e.g., an integrated GPS receiver, is required. In addition, the advantage of the described process consists in that the determination and transfer of the parameters of the mobile radio network 3 can be coupled to the determination of position 100 of the mobile subscriber terminal device and transferred for analysis by means of standardized processes to signaling channels (e.g., according to GSM, UMTS, E-UTRAN/LTE or WiMAX standards); in contrast to the known processes, no traffic channel is engaged, or no channel resources are required by the sending out of SMS, as described in DE 199 00 543.

Another advantage of the process according to the invention is provided by the introduction of measurements, necessary in any case (both the network parameters and the position) that results in a considerable saving of battery capacity: the mobile terminal device 1 introduces, e.g., the determination of its own position 100 automatically and independently to obtain site-dependent information and transfers only additional further information to the mobile radio network 3 that provides information to the mobile radio network operator on the condition of his network 3 at the current position 100 of the user. To determine the selected position 100 of a mobile radio device and to make available this information for a Location Based Service (LBS), in general connections are necessary between the mobile station 1 and the mobile radio network 3 for transfer to the determined position. In general, in connection with the design of this connection, measured data of the subscriber terminal device 1 are also acquired in the requirement of the network 3 (e.g., based on the signaling from an RNC in a UMTS network) and are forwarded to the RNC for maintaining the connection by the terminal device 1 (for example, CPICH RSCP or Ec/No measurements). Concerning this, according to the process of this invention, however, the latter are linked to the current position 100 of the acquisition site and are forwarded both to the RNC (here, in the case of UMTS), the eNB (in the case of E-UTRAN/LTE) for maintaining the connection, and to a corresponding acquisition, analysis and processing unit 2 for acquiring the network parameters in the mobile radio network 3.

The determination of position 100 of the currently performed network quality measurement is carried out by, for example, use of an integrated GPS receiver in the mobile terminal device 1 or by other known processes (based on "cell identity," OTDOA, ETDOA, etc. [3GPP TS 25.305]) that, however, based on their composition, produce a less exact determination of the current position of the mobile terminal end customers.

As an alternative, the determination of the position 100 and the corresponding parameters of the mobile radio network 3 corresponding to the process according to the invention is preferably carried out every time that the position 100 of the mobile terminal device 1 is performed on the user's demand or an application specified by him.

The determined parameters of the mobile radio network 3 are forwarded for subsequent storage and further processing without the features identifying the subscriber (e.g., IMSI, P-TMSI) to an acquisition, analysis and processing unit 2 that is provided by the network operator. The parameters that come in here from a large number of subscribers can be analyzed statistically and can be recruited by the large number of these data to perform an optimizing of the mobile radio network 3.

As a side effect of this process, these anonymized data can be used to make an assessment of at what spatial positions of a mobile radio network and at what times in each case corresponding interrogations are made to determine the position of a mobile terminal device. From this, advantageously site-linked information services can be provided.

A further development of the process according to the invention (FIG. 1) makes it possible for the network operator, within a certain field 4 (e.g., based on Location Areas (LA), Routing Areas (RA) or cell ID in mobile radio systems according to UMTS and GSM standards, or based on UTRAN Registration Area (URA) (in UMTS mobile radio systems) or Tracking Areas (TA) in E-UTRAN/LTE systems), to configure mobile radio devices with incorporated GPS receivers 1 so that the latter perform predefined network quality measurements after entry into a predefined field 4 (Cell ID, LA, RA, URA, TA) and forward them to the acquisition, analysis and further processing unit of the network 2. In the example depicted in FIG. 1, the predefined field 4 comprises several cells of the cellular mobile radio network 3.

Figure 2A:
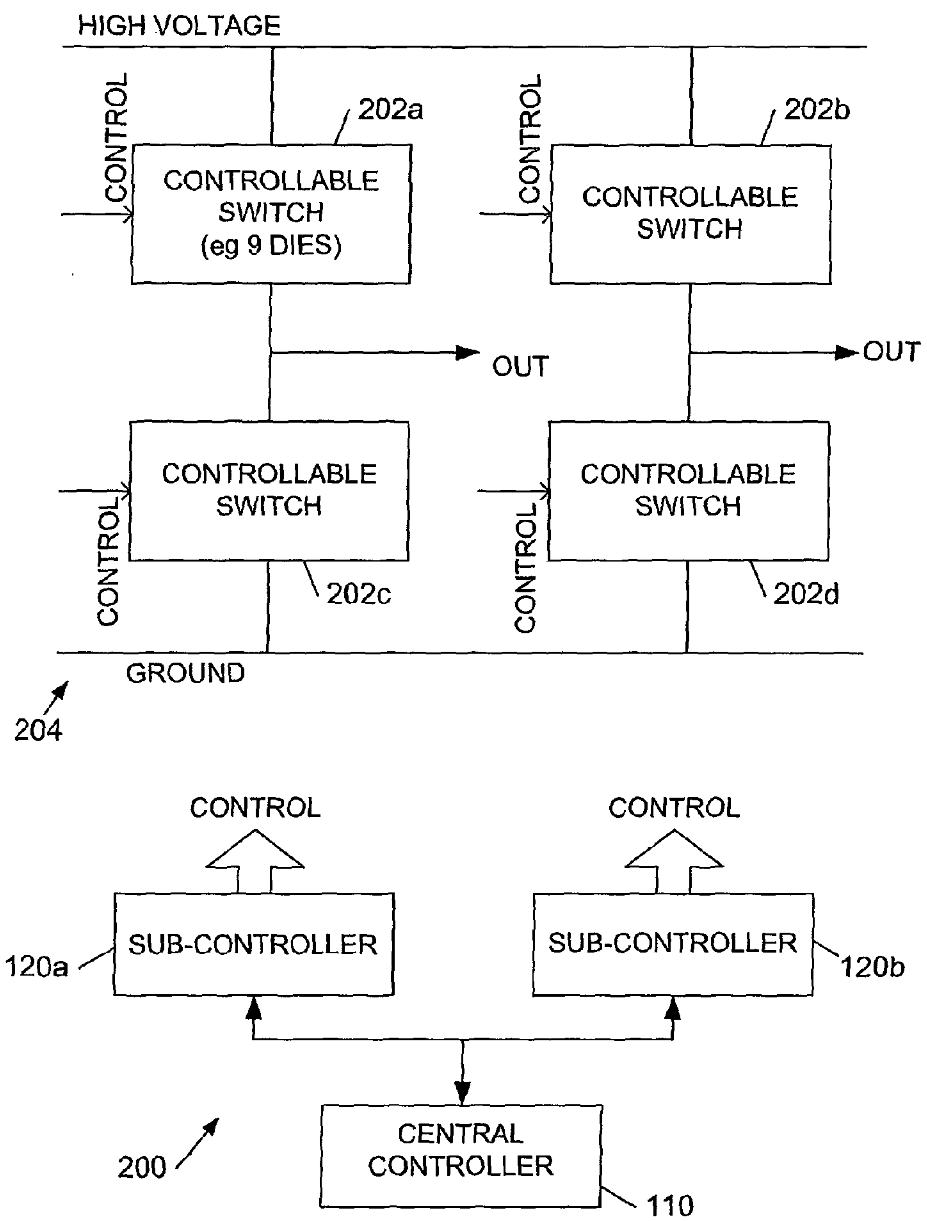
FIG. 2 diagrammatically shows cells of a mobile radio network and a definition of a measuring field based on geographic data of a polygon.
Figure 2B:
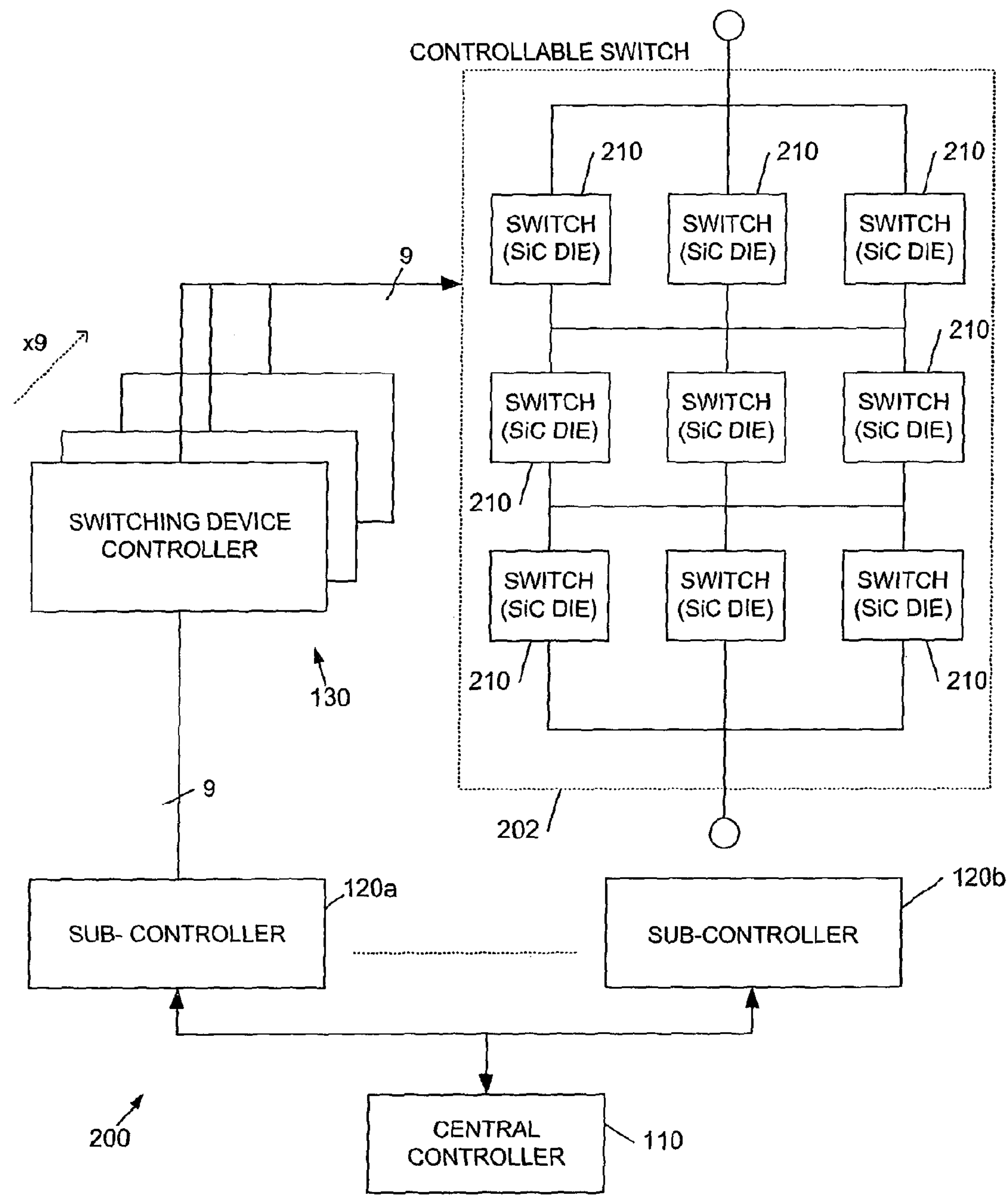

With reference to FIG. 2, for example, the definitions of polygons 5 within the mobile radio network 3 are proposed in another design of the process according to the invention as fields, whereby the preconfigured subscriber terminal device 1 executes predefined measurements when entering this field 5 and forwards them to the acquisition, analysis and processing unit 2. For example, based on positional corner points 6 (according to the Gauss-Kreuger System or another GIS system), a field 5 could be defined in which exact measured data are of interest for a mobile radio operator.

Figure 3A:
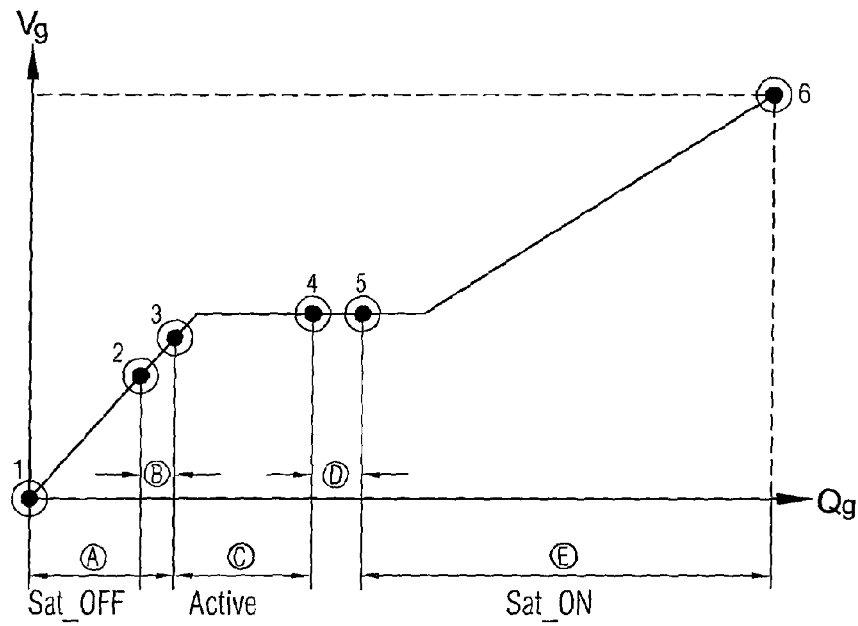
FIG. 3 diagrammatically shows cells of a mobile radio network and a definition of a measuring field through a circle with radius R.
Figure 3B:
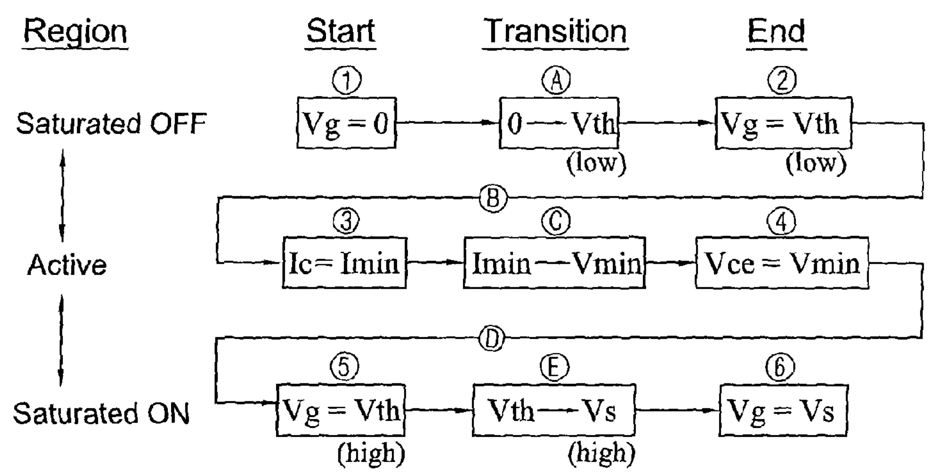
Figure 3C:
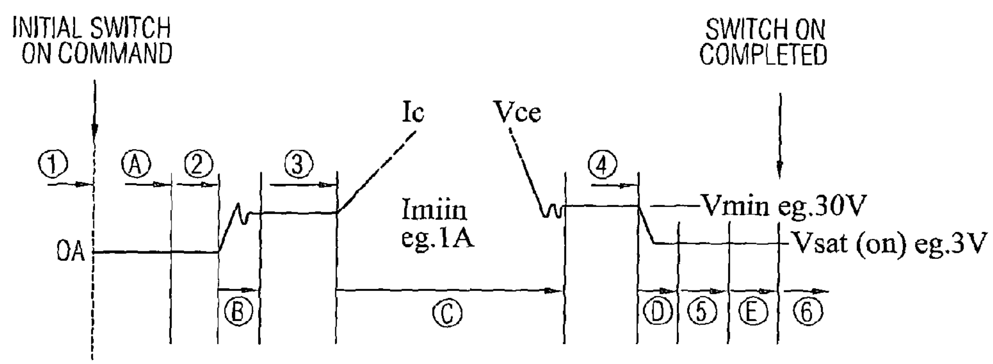
Figure 5A:
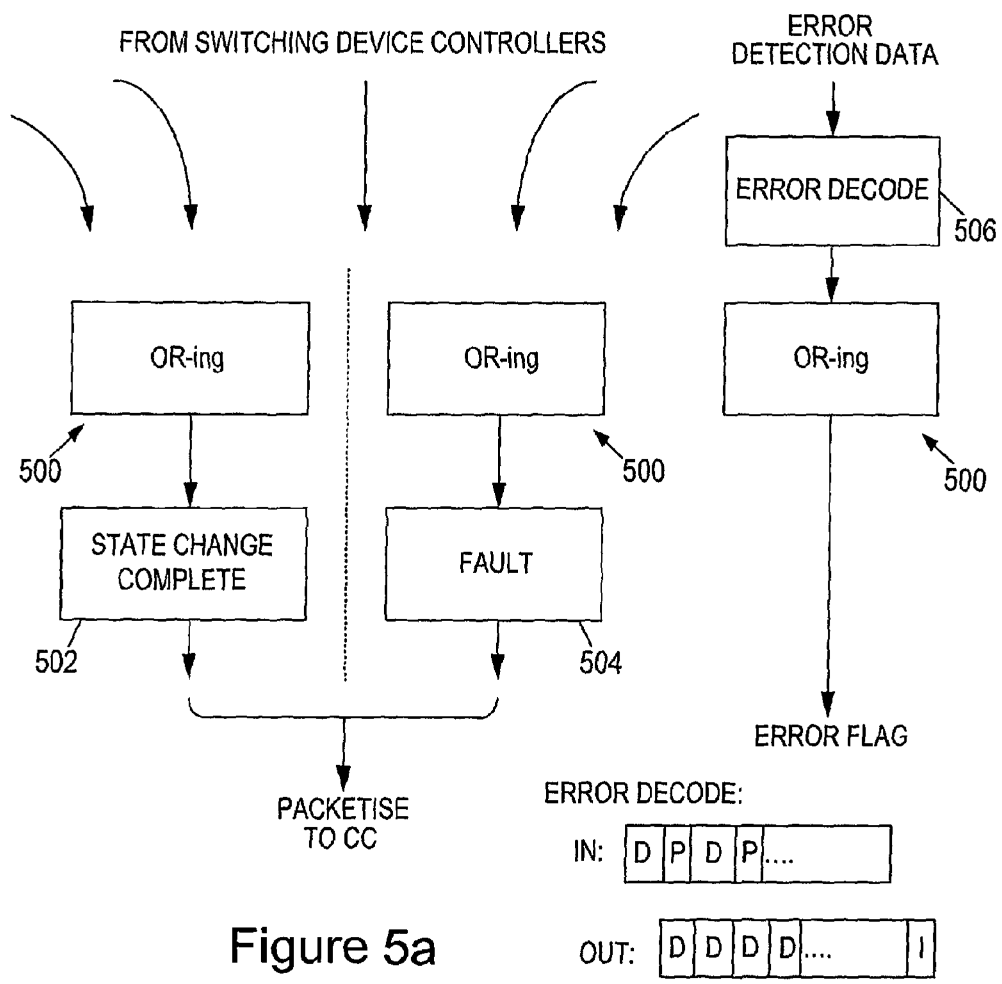

According to FIG. 3, the form of the predefined field 5 in this case can be, for example, a circle 7 with a radius R around a defined position 101.

In the alternatives, not shown, the field is defined by a rectangle or a freely defined open polygon. The decisive advantage in this design is in the reduced requirement for the number of measurements, since an exactly defined field 4, 5 or 7 can be acquired.

As an additional feature, a time component can also be recruited for all embodiments that are described above: a preconfiguration of the measurements thus also contains a time component, whereby the measurements to be determined are performed only during a predefined time interval (e.g., only between 1600 hours and 2000 hours) and are forwarded to the acquisition, analysis and processing unit 2 of the network 3 (or the combination based on location and time). The possibility of the preconfiguration of the acquisition time offers the network operator the option of being allowed to determine the real measured data in a specific time interval by the user, e.g., only during the so-called "busy hour" or only during certain hours of the night, e.g., if a network upgrade was performed and some measurements are too cost-intensive. Additional conditions for a measurement are conceivable, such as the measurement when falling below or exceeding the threshold values of parameters; the subscriber terminal devices can be defined relative to the network.

In addition, the local storage of the acquired measured data is also conceivable at position 100 and acquisition time in the terminal device 1 of the customers, whereby the local storage makes it possible to forward data in low traffic times (e.g., at night). The preconfiguration of a defined acquisition field 4, 5, or 7 makes it possible for the network operator to be able to acquire certain fields of his network 3 by network subscribers 1 that are of special interest to him and optionally can be dynamically changed.

All embodiments of the proposed process allow the acquisition of parameters of the mobile system, and this occurs regardless of whether currently a message runs between subscriber terminal device 1 and network 3 (e.g., during a discussion/data transfer—"active mode") or the subscriber terminal device 1 is located only in receiver standby ("idle mode"). Only when no connection is possible between subscriber terminal device 1 and network 3, as in, for example, a poorly supplied field, measured values, such as information regarding neighboring networks and networks of other access technologies, can be stored in the subscriber terminal device 1 and are made available to the network in the presence of a new connection to network 3.

Figure 4A:
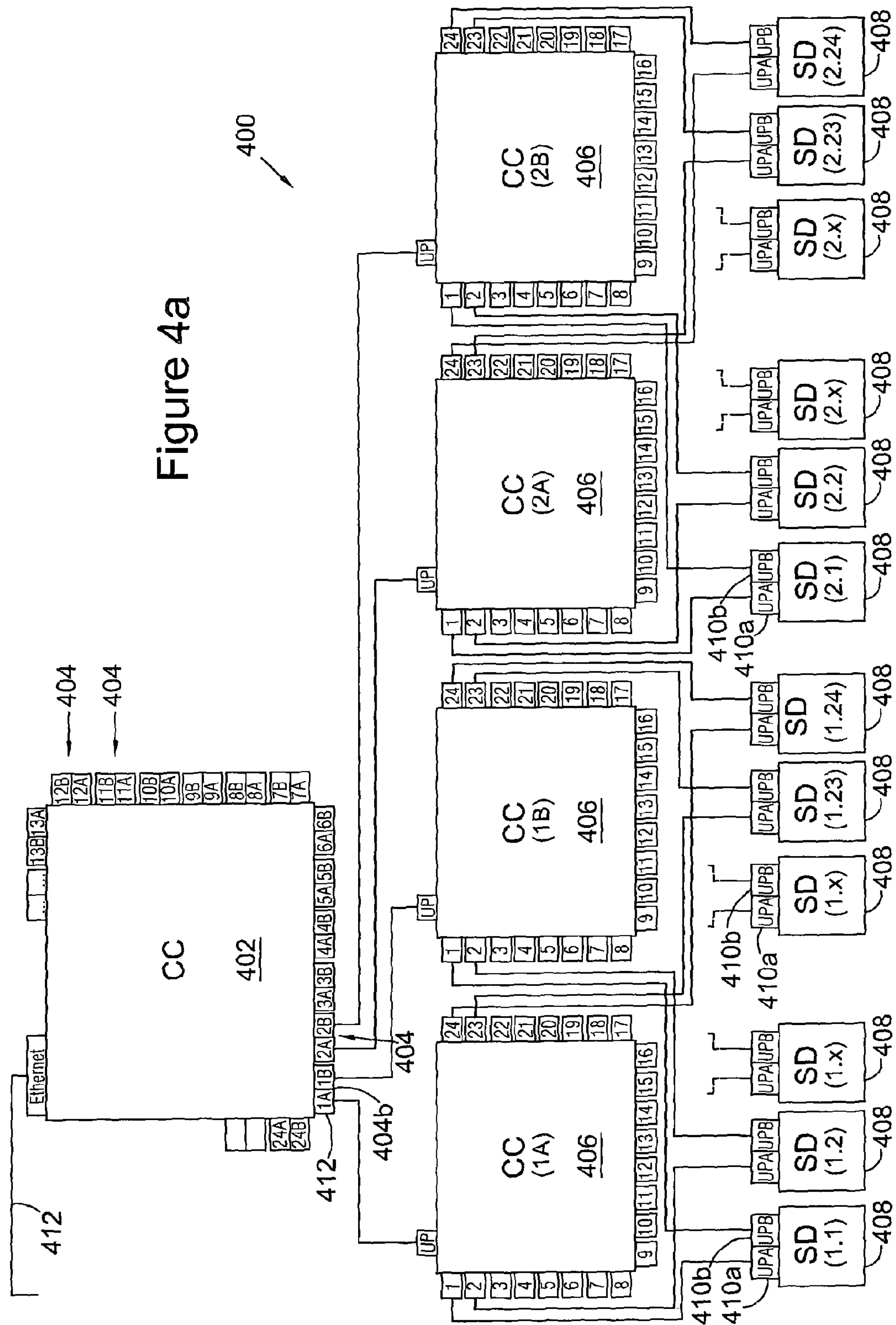
FIG. 4 shows the information exchange between acquisition, analysis and processing unit (EAV), base station system (BTS), and mobile radio terminal device (UE).
Figure 4B:
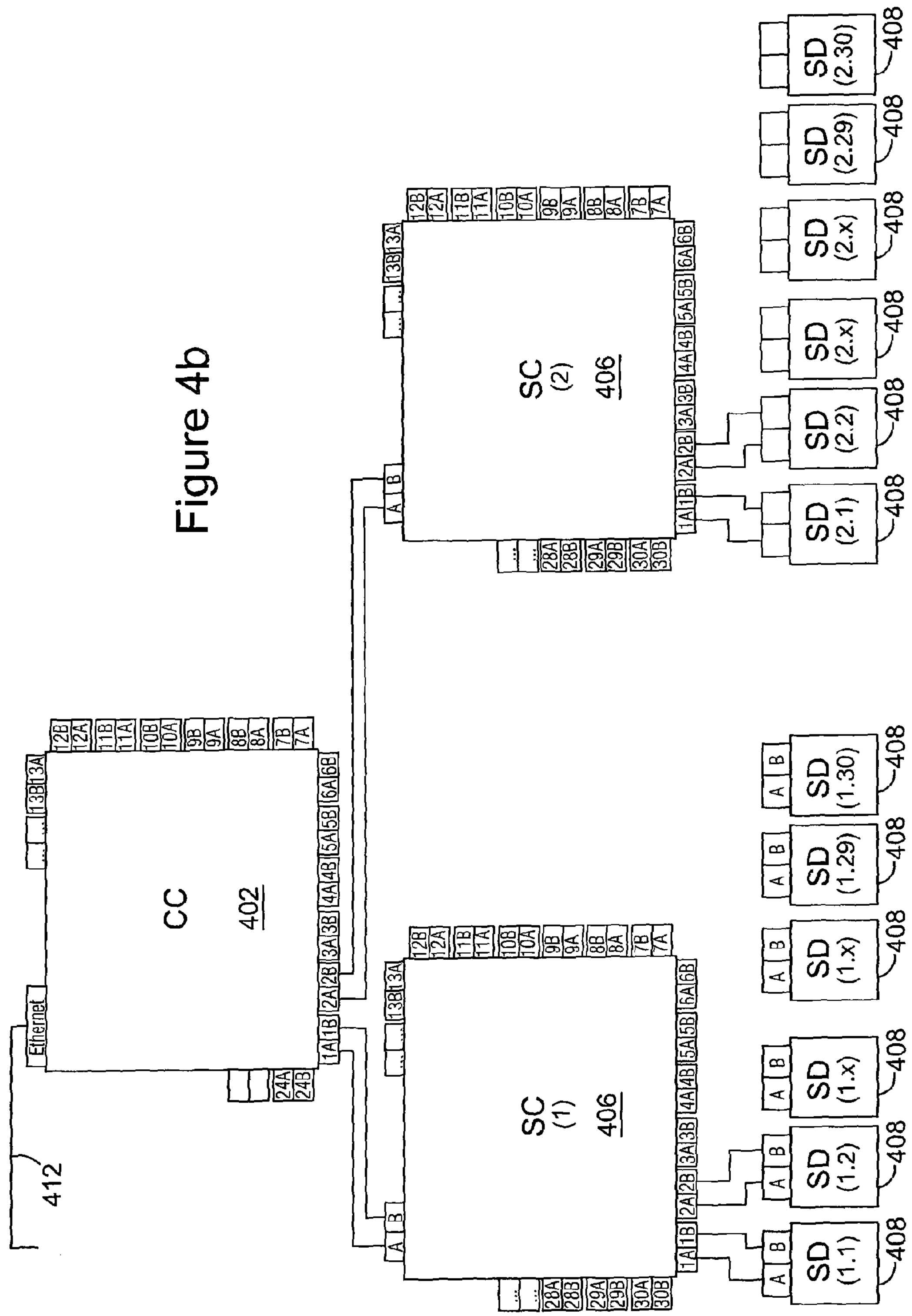
Figure 5B:
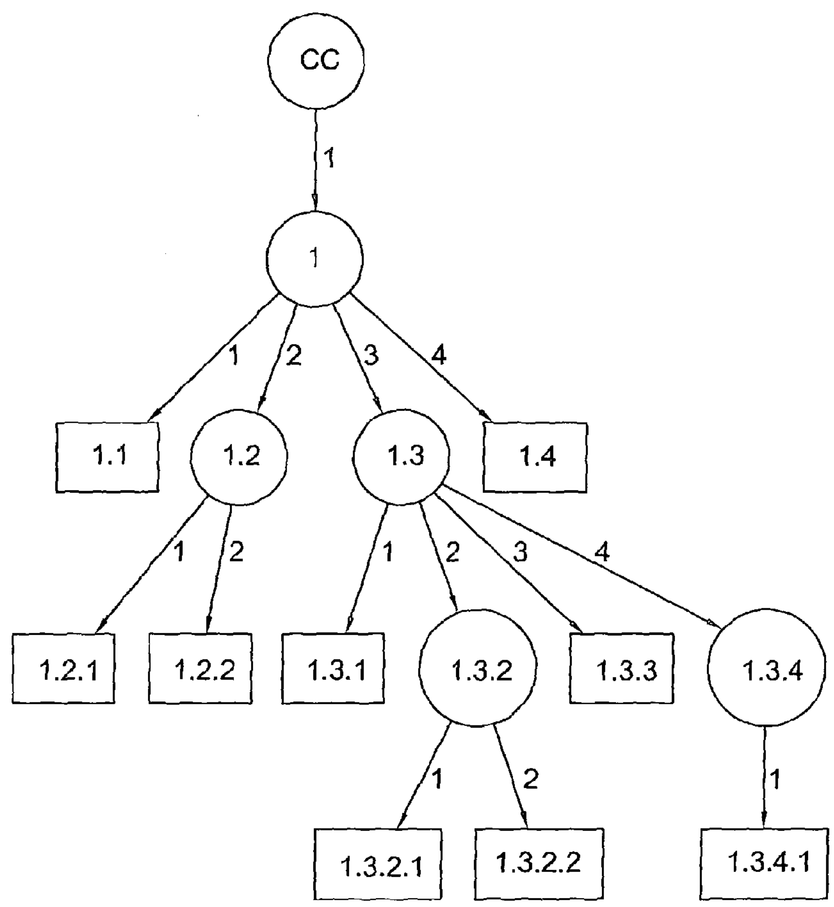
Figure 5C:
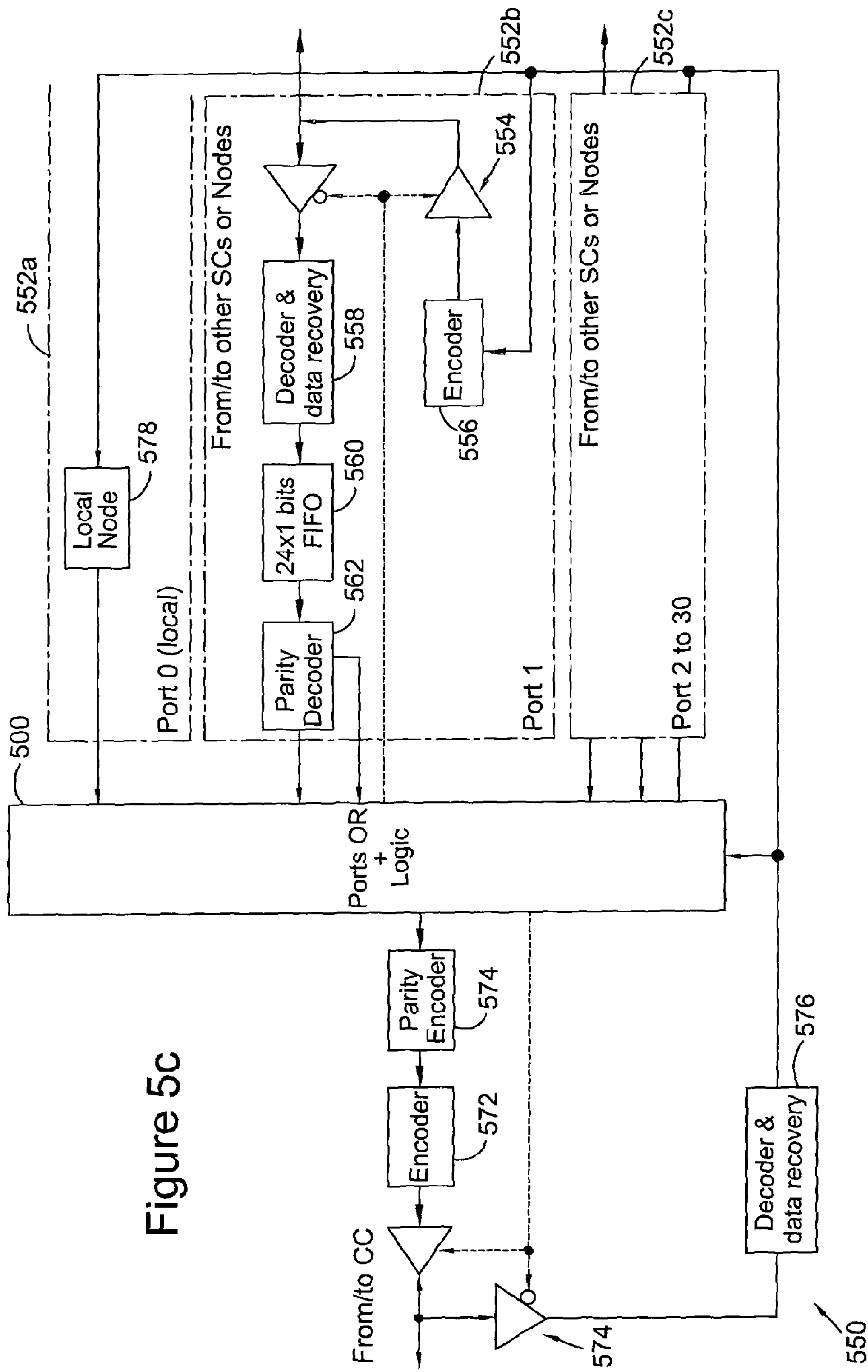
Figure 6B:
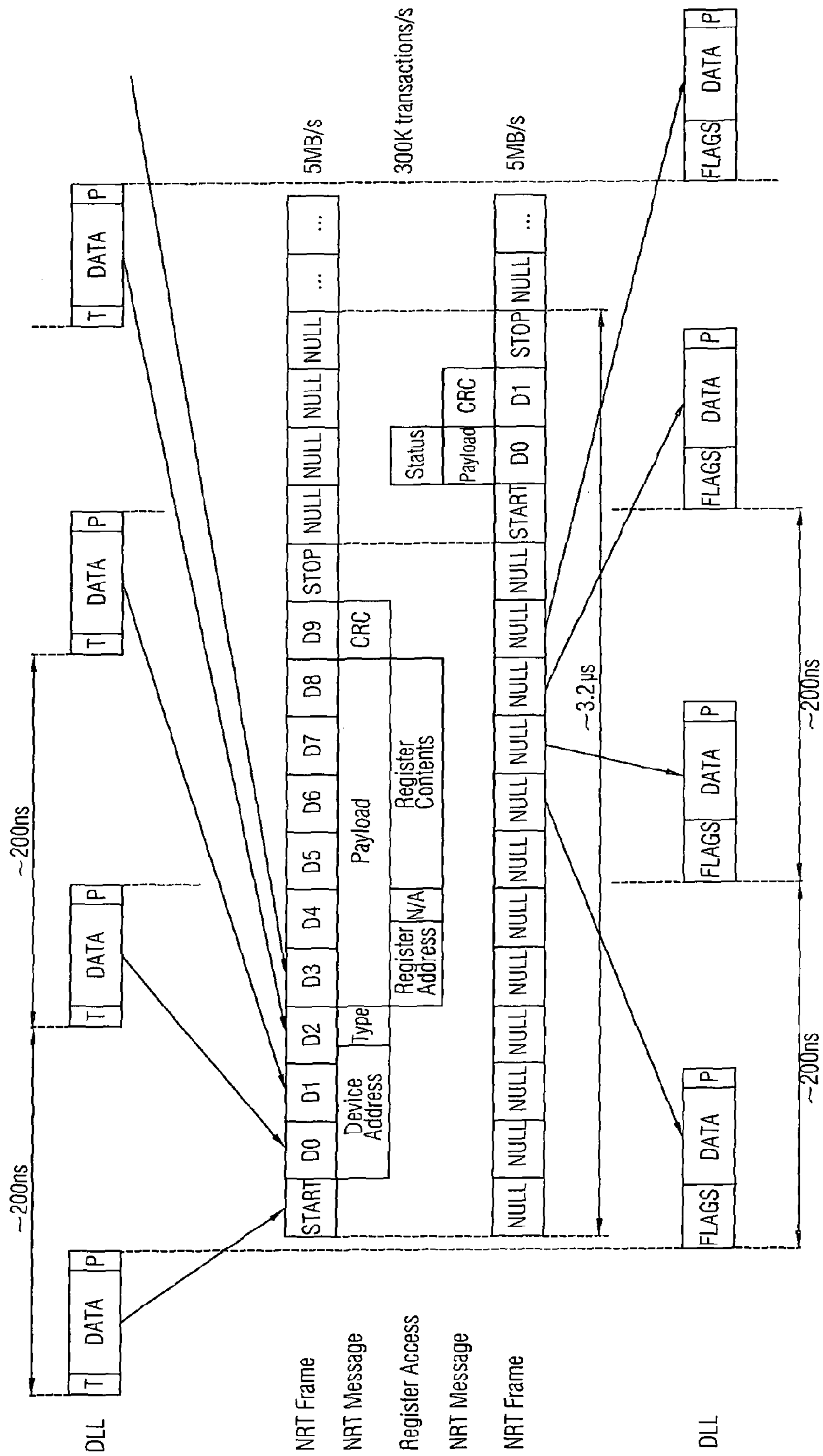
Figure 6C:
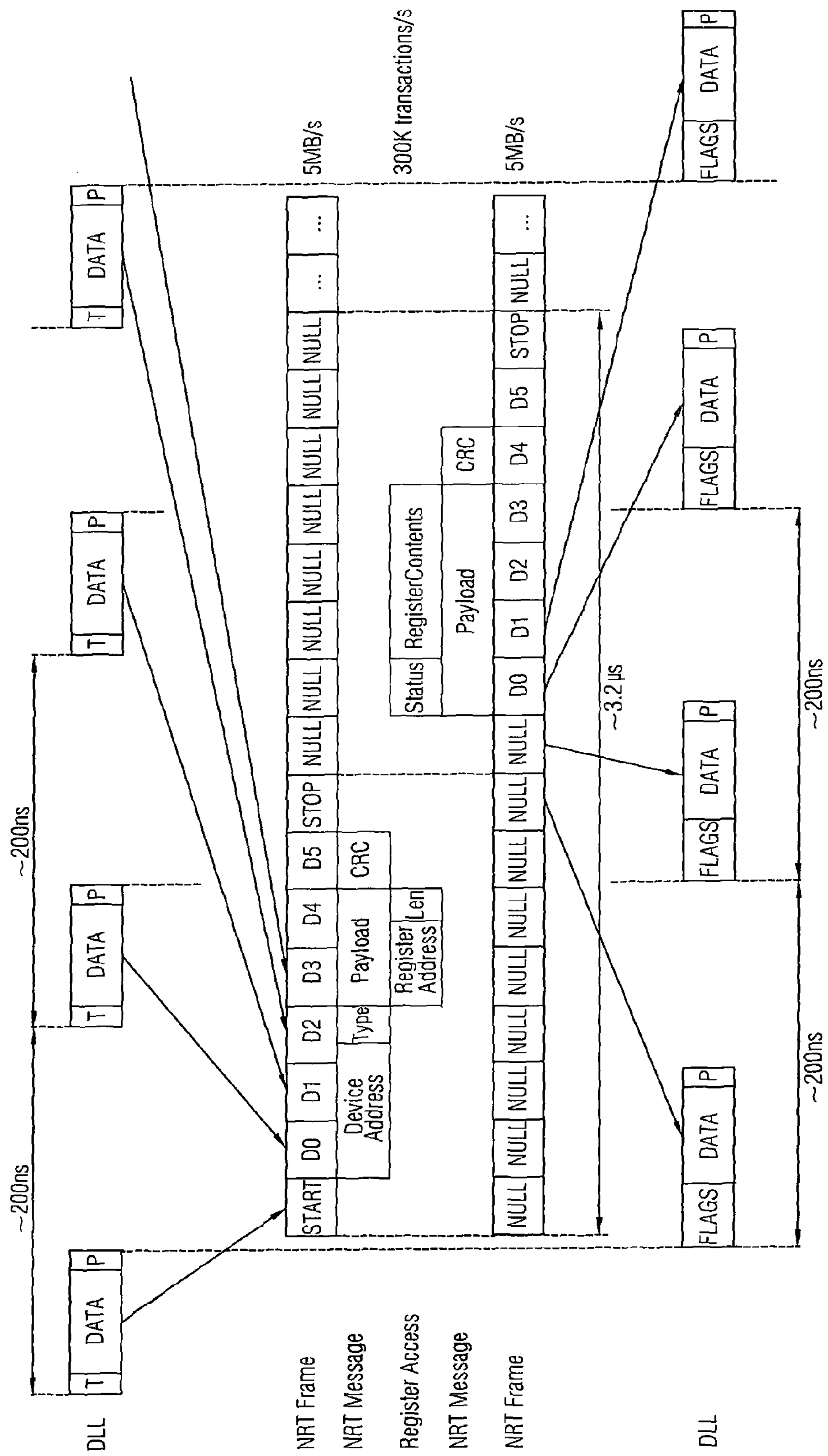

In FIG. 4, an example communication process for the configuration, the determination and the reporting of the desired measurements is shown.

The acquisition, analysis and processing unit "EAV" 200 of the mobile radio network 3 decides in step 300 on the necessary acquisition of characteristic data of the mobile radio system. To this end, a decision on the measuring object ("object," or CPICH Ec/No), the measuring field ("field") and optionally a time limitation of the measurements ("time") is necessary. The acquisition, analysis and processing unit 200 determines the corresponding BTS/NB/eNB 201 based on the existing geographic topologies of the mobile radio network. If, for example, measurements are required in a certain Location Area (LA) of the mobile radio network, all BTS/NB/eNB 201 that are part of this LA are directed by means of a corresponding message 301 to task mobile radio terminal devices with measurements in the area of the respective BTS/NB/eNB 201. The latter can comprise all or only one part of the mobile radio terminal devices in the corresponding area that is determined in step 302 by the BTS/NB/eNB 201. The BTS/NB/eNB 201 sends to the selected mobile radio terminal devices (UE) 202 a corresponding configuration message 303 with the corresponding information regarding "events"—for example if a certain measured value ("object") has fallen below or exceeded a set value—the number of the report "number" to be sent, the field ("field") in which the measuring task has validity, and optionally a time limitation when the measurements are to be made ("time"). After the configuration message 303 is received, the UE 202 examines in the step 304 the corresponding current situation with the measuring instructions indicated in the configuration. If the corresponding event occurs in step 305, the UE performs the corresponding measurements; it links with the position of the measurement and optionally the time, and it sends in a MEASURING REPORT 306 to the corresponding BTS/NB/eNB 201. In step 307, the BTS/NB/eNB 201 removes subscriber-specific identifiers (e.g., TMSI) of the reporting UEs 202 and sends a measuring protocol message SON REPORT 308 (SON: "Self-Optimizing Network") to the acquisition, analysis and processing unit 200. As an alternative, the BTS/NB/eNB can collect a number of MEASURING REPORTS in step 307 and send them together in step 308 to the acquisition, analysis and processing unit. Thus, the determined data, i.e., the parameters 306 or the data carried together in the base station eNB 201, i.e., the parameters 308, are transferred to the acquisition, analysis, and processing unit 200.

The incoming SON REPORTs 308 of the respective base station BTS/NB/eNB 201 of various UEs 202 are then further processed in the acquisition, analysis and processing unit 200 and are worked up and further processed for the planning and optimization process of the mobile radio network operator.

The invention claimed is:

1. A method of communicating switching data in a power semiconductor switching device control system comprising a coordinating control system and a plurality of switching device controllers each coupled to said coordinating control system and each configured to control a respective power semiconductor switching device, the method comprising the steps of:

formatting switching control data as one or more switching control data packets whose switching control data comprises data for controlling switching of a combination of said power semiconductor switching devices;

sending said one or more of the switching control data packets from said coordinating control system to said switching device controllers controlling respective power semiconductor switching devices;

detecting, providing, and then formatting state data representing states of a plurality of said power semiconductor switching devices controlled in combination by said one or more switching control data packets into a plurality of acknowledgement data packets from said power semiconductor switching devices, the state data representing a state of a said power semiconductor switching device being formatted by combination with fault data representing a potential fault in switching of said power semiconductor switching device such that the fault data is represented by one or more fault data bits of said acknowledgment data packet; and sending said plurality of acknowledgement data packets from said plurality of switching device controllers to said coordinating control system.

2. The method as claimed in claim 1 wherein said coordinating control system comprises a central controller coupled to one or more sub-controllers, the sub-controllers are coupled to said central controller via a shared bus, and each sub-controller is coupled to the respective switching device controller via a respective dedicated bus.

3. The method as claimed in claim 1 wherein the switching control data packets comprise device or device group address data addressing one or more of said switching device controllers, and the sending of said one or more switching control data packets comprises broadcasting said one or more switching control data packets.

4. The method as claimed in claim 1, further comprising the step of:

detecting the potential fault in a power semiconductor switching device by ORing together said fault data bits of said received formatted data of the acknowledgment data packet.

5. The method as claimed in claim 4 wherein said formatting into the acknowledgment data packets further comprises adding error detection data for the respective state data and/or the respective fault data, the method further comprising the step of:

processing said error detection data to detect and/or correct errors in the state data and/or the fault data.

6. The method as claimed in claim 5, further comprising the step of:

processing said error detection data to detect and/or correct errors in said fault data, the detection of a potential fault being responsive to said error detection data processing.

7. The method as claimed in claim 5 wherein said error detection data comprises data for a progressive error detection code, the adding of said error detection data being adding one or more bits of said error detection data to bits of the state data and/or the fault data.

8. A method of communicating switching data in a power semiconductor switching device control system comprising a coordinating control system and a plurality of switching device controllers each coupled to the coordinating control system and each configured to control a respective power semiconductor switching device, the method comprising the steps of:

formatting switching control data as one or more switching control data packets whose switching control data comprises data for controlling switching of a combination of the power semiconductor switching devices;

sending the one or more of the switching control data packets from the coordinating control system to the switching device controllers controlling respective power semiconductor switching devices;

detecting, providing, and then formatting state data representing states of a plurality of the power semiconductor switching devices controlled in combination by the one or more switching control data packets into a plurality of acknowledgment data packets from the power semiconductor switching devices;

sending the plurality of acknowledgment data packets from the plurality of switching device controllers to the coordinating control system, the switching control data packets and said acknowledgment data packets being real time data packets; and sending non-real time data packets from said switching device controllers to said coordinating control system such that each non-real data packet comprises measurement data relating to a said power semiconductor switching device.

9. A method of communicating switching data in a power semiconductor switching device control system comprising a coordinating control system and a plurality of switching device controllers each coupled to the coordinating control system and each configured to control a respective power semiconductor switching device, the method comprising the steps of:

formatting switching control data as one or more switching control data packets whose switching control data comprises data for controlling switching of a combination of the power semiconductor switching devices;

sending the one or more of the switching control data packets from the coordinating control system to the switching device controllers controlling respective power semiconductor switching devices;

detecting, providing, and then formatting state data representing states of a plurality of the power semiconductor switching devices controlled in combination by the one or more switching control data packets into a plurality of acknowledgment data packets from the power semiconductor switching devices; and sending the plurality of acknowledgment data packets from the plurality of switching device controllers to the coordinating control system, the switching control data packets and the acknowledgment data packets being real time data packets, the method further comprising the step of:

sending the non-real time data packets from said coordinating control systems to said switching device controllers such that the non-real time data packet comprise configuration data for configuring the respective switching device controller.

10. The method as claimed in claim 9, further comprising the steps of:

providing each switching device controller with a pair of configuration data storage areas each having at least one configuration register for storing data defining a configuration of a respective one of the switching device controllers;

controlling a configuration of each switching device controller using data in a first, active said configuration data storage area; and configuring each switching device controller by:

i) sending a non-real time data packet holding configuration data for an updated configuration of the respective switching device controller to the respective switching device controller;

ii) writing said configuration data in a second, non-active said configuration data storage area; and iii) using the real-time data packet to swap control of or copy said configuration of said switching device controller between said first and second configuration data storage areas to activate said updated configuration for said switching device controller.

11. A method of processing switching data in a power semiconductor switching device control system, said control system comprising:

a coordinating control system; and a plurality of switching device controllers each coupled to said coordinating control system and each configured to control a respective power semiconductor switching device;

the method comprising:

detecting, providing, and formatting data for sending from said switching device controllers to said coordinating control system by combining state data representing a state of the respective power semiconductor switching device with fault data representing a potential fault in switching of the respective power semiconductor switching device, the fault data being represented by one or more fault data bits of a said formatted data;

sending said formatted data from a plurality of said switching device controllers to said coordinating control system; receiving said formatted data at said coordinating control system; and detecting one of the potential faults in a one of the power semiconductor switching devices by ORing together said fault data bits of said received formatted data, the formatting comprising the step of adding error detection data for the state data and/or the fault data; and processing said error detection data to detect and/or correct errors in said fault data, the detection of a potential fault being responsive to said error detection data processing.

12. The method as claimed in claim 11, wherein said sending of said formatted data comprises sending at least some of said formatted data over a serial communications path, error detection data is data for a progressive error detection code, and the adding of said error detection data comprises adding one or more bits of said error detection data to bits of the state data and/or the fault data.

* * * * *